(12) United States Patent
Liu

(10) Patent No.: US 7,443,237 B1
(45) Date of Patent: Oct. 28, 2008

(54) FOLDED CASCODE AMPLIFIER HAVING IMPROVED SLEW PERFORMANCE

(75) Inventor: Hengsheng Liu, Colorado Springs, CO (US)

(73) Assignee: Linear Technology Corporation, Milpitas, CA (US)

( * ) Notice: Subject to any disclaimer, the term of this patent is extended or adjusted under 35 U.S.C. 154(b) by 203 days.

(21) Appl. No.: 11/445,237

(22) Filed: Jun. 2, 2006

(51) Int. Cl.
*H03F 3/45* (2006.01)
(52) U.S. Cl. .................... 330/253; 330/260
(58) Field of Classification Search ................ 330/253, 330/260
See application file for complete search history.

(56) References Cited

U.S. PATENT DOCUMENTS

| | | | |
|---|---|---|---|
| 5,475,339 A * | 12/1995 | Maida | 327/561 |
| 5,477,189 A | 12/1995 | Koifman et al. | |
| 6,043,708 A | 3/2000 | Barr | |
| 6,590,453 B2 | 7/2003 | Tran et al. | |
| 6,762,646 B1 | 7/2004 | Bell | |
| 7,342,450 B2 | 3/2008 | Jones | |

* cited by examiner

*Primary Examiner*—Robert Pascal
*Assistant Examiner*—Khiem D Nguyen
(74) *Attorney, Agent, or Firm*—McDermott Will & Emery LLP

(57) ABSTRACT

A folded cascode amplifier having improved slew comprises an input differential transistor pair circuit, a cascode branch circuit coupled to the differential pair circuit, and a boost circuit for increasing branch current when the amplifier is in a slew condition. The additional current increases slew of the amplifier without negatively affecting amplifier characteristics.

14 Claims, 8 Drawing Sheets

FOLDED CASCODE AMPLIFIER HAVING IMPROVED SLEW PERFORMANCE

TECHNICAL FIELD

This disclosure relates generally to operational amplifiers, and more particularly to a novel folded cascode amplifier topology having improved slew performance.

BACKGROUND

The so-called folded-cascode amplifier is a widely used topology in analog circuits. Shown in FIG. 1 is a circuit diagram of a folded-cascode amplifier circuit 10, of a type known in the prior art, which comprises an input circuit 12 and folded cascade branch circuit 14 coupled between supply lines V+, V−. Input circuit 12 is a differential transistor amplifier in the form of a differential input pair M1, M2 having their sources connected commonly to receive a source S1 of tail current $2I_0$, gates connected for receiving an input signal at Vin+, Vin− to be amplified and drains connected to the cascode load transistors M3, M4 of a cascode branch circuit 34. Cascode load transistors M3, M4 are gate biased into saturation by a current source S2 and diode-connected transistor M0.

Cascode branch circuit 14 is a cascode network of transistors M3-M10, interconnected as shown and coupled to the input circuit by branches 14a, 14b. The sources of transistors M7, M8 are connected to the positive voltage supply line V+, the drains of which are connected to the sources of transistors M9, M10. The drains of transistors M9, M10 in turn are connected respectively to the drains of transistors M5, M6.

The gates of transistors M9, M10 are connected to a source of fixed bias voltage $V_{b1}$, and the gates of transistors M5, M6 to a source of bias voltage $V_{b2}$. The source of transistor M5 is connected to the drains of transistors M2, M4, and the source of transistor M6 is connected to the drains of transistors M1, M3. The gates of transistors M7, M8 are connected to the drains of transistors M9, M5.

Transistors M1-M10 are NMOS and PMOS transistors in the circuit configuration shown, although other transistor types and topologies may be used in a folded-cascode type amplifier. The output of the amplifier 10, taken at the drains of transistors M10, M6, drives an external load, that for illustration includes a capacitance $C_L$.

Transistors M7, M9, connected as shown, form a wide swing cascode current mirror whose current is reflected to transistor M8. Transistors M9, M10, in the cascode circuit are biased into saturation by gate bias $V_{b1}$, $V_{b2}$, produced by bias sources, not shown. Transistors M5, M6 are connected in cascade with transistors M9, M10.

Transistors M1, M2, together with current source S1, steer tail current $2I_o$ between the two sides of the differential pair to cascode load transistors M3, M4 in response to differential input voltage $(V_{in+}-V_{in-})$. When $V_{in+}$ is much larger than $V_{in-}$, most of the tail current $2I_o$ flows through M2 and load transistor M4; when $V_{in+}$ is much smaller than $V_{in-}$, most of the tail current $2I_o$ flows through M1 and load transistor M3. When the input voltages are equal, an equal current $I_o$ (one-half the tail current) flows to each of the load transistors M3, M4.

Also applied to load transistors M3, M4 is a fixed current $I_1$ produced by the current mirror M7, M9 and associated cascode branch transistors M5, M6, M8, M10. The current $I_{d3}$ through load transistors M3, M4 is the sum of tail current $I_o$ from input transistor pair M1, M2 and current $I_1$ from the cascode circuit 14.

The slew rate SR of the folded cascode amplifier shown in FIG. 1 is determined by the smaller of the tail current $2I_o$ and current $I_{d3}$, that is:

$$SR = \min(2I_o, I_{d3})/C_L \quad (1)$$

If $I_o$ is chosen to be greater than $I_1$, that is, the current through transistors M1, M2 is greater than $I_1$ though branches 14a, 14b of the folded cascode circuit 14, the slew rate is:

$$SR = I_{d3}/C_L < 2I_o/C_L \quad (2)$$

and current in one branch of the cascode circuit 14 will be zero. Under this condition, the amplifier will take a relatively long time to recover. Designs accordingly tend to allocate more current in the cascode circuit. However, this practice degrades offset and noise performance of the amplifier. If noise contribution from transistors M5, M6, M9 and M10 is ignored, the input referred noise of the amplifier is:

$$VN_{in}^2 = \qquad (3)$$

$$VN_{m1}^2 + VN_{m2}^2 + \frac{g_{m3}^2}{g_{m1}^2}VN_{m3}^2 + \frac{g_{m4}^2}{g_{m1}^2}VN_{m4}^2 + \frac{g_{m7}^2}{g_{m1}^2}VN_{m7}^2 + \frac{g_{m8}^2}{g_{m1}^2}VN_{m8}^2 =$$

$$\frac{8kT}{3g_{m1}} + \frac{8kT}{3g_{m2}} + \frac{8g_{m3}kT}{3g_{m1}^2} + \frac{8g_{m4}kT}{3g_{m1}^2} + \frac{8g_{m7}kT}{3g_{m1}^2} + \frac{8g_{m8}kT}{3g_{m1}^2}$$

where $g_{mi}$ is the transconductance of each transistor.

The thermal noise of a MOS transistor is proportional to the reciprocal if its transconductance. Reducing branch current $I_1$ will help reduce the transconductances of M3-M10, thus also reducing the input referred thermal noise. This is also true for flicker noise and voltage offset. Conventional practice accordingly must trade off noise offset performance with slew rate and recovery time. Gain bandwidth product is $G_{m1}/C_L$, independent of the cascode branches.

In some applications where low 1/f noise is required, a pair of resistors R1 and R2 may be used to replace NMOS transistors M3, M4, as shown in FIG. 2. In this Figure, the gate bias $V_{b2}$ of transistors M5, M6 which biases those transistors at saturation, is produced by a current source $I_b$ that drives a diode-connected M11 in series with a resistor R3. Voltage Vb1, produced by a similar bias circuit, biases transistors M9, M10 at saturation Although not depicted, transistors M11, M5 and M6 in FIG. 2 can be replaced by NPN transistors to reduce 1/f noise further and increase DC gain. As previously explained, it is common practice to make $I_1 > I_o$. This approach, however, sacrifices noise and offset performance.

SUMMARY

A folded cascode amplifier of the above described type is improved by increasing branch current only when the amplifier is in a slew condition. The improved folded cascode amplifier comprises a differential input circuit that includes a differential transistor pair coupled to a source of tail current and to an input voltage node for responsively conducting a differential first current, a cascode branch circuit coupled to the differential input circuit for supplying a second current thereto, and a boost circuit for increasing the second current only when the amplifier is slewing. Various implementations are presented.

Additional advantages of the present subject matter will become readily apparent to those skilled in this art from the following detailed description, wherein only the preferred embodiment of the invention is shown and described, simply by way of illustration of the best mode contemplated of carrying out the invention. As will be realized, the described subject matter is capable of other and different embodiments, and its several details are capable of modifications in various obvious respects, all without departing from the invention. Accordingly, the drawings and description are to be regarded as illustrative in nature, and not as restrictive.

DETAILED DESCRIPTION OF THE EMBODIMENTS

Figure 1:
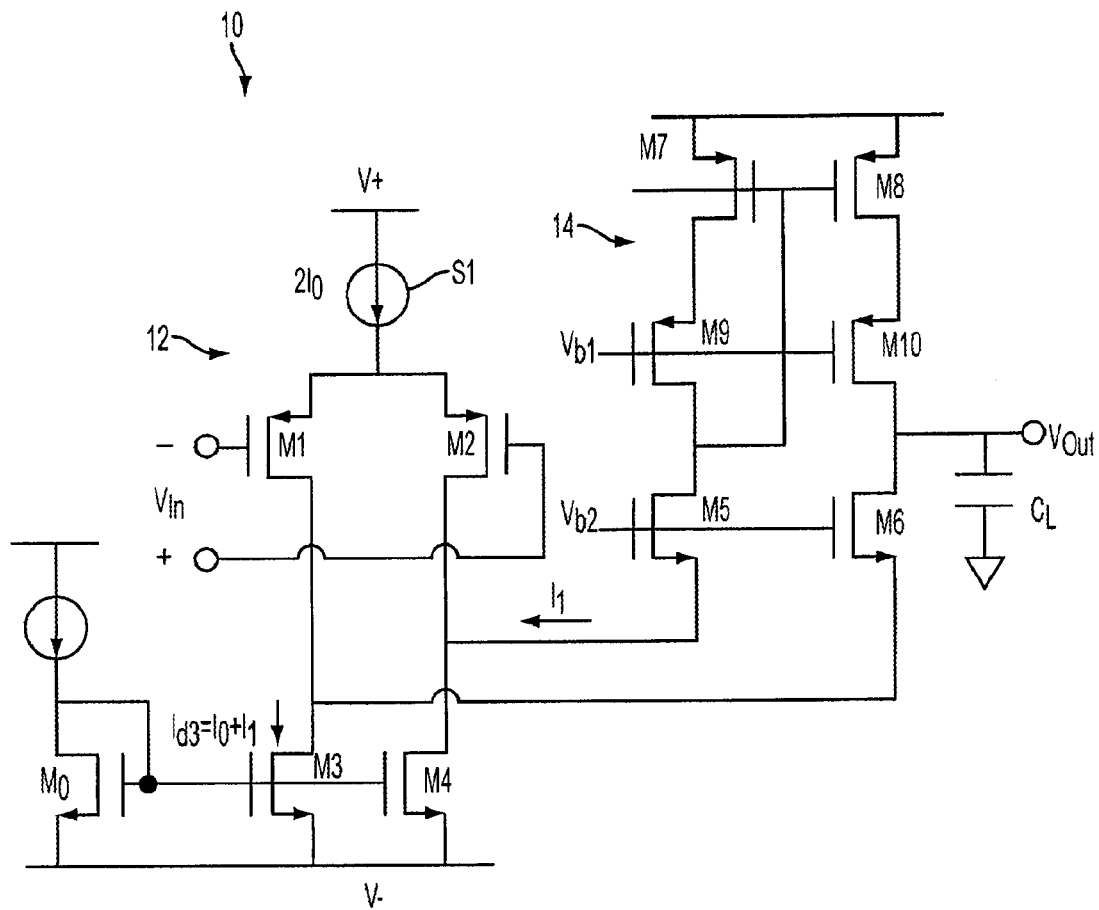
FIG. 1 is a diagram of a folded-cascode amplifier topology of the prior art.
Figure 2:
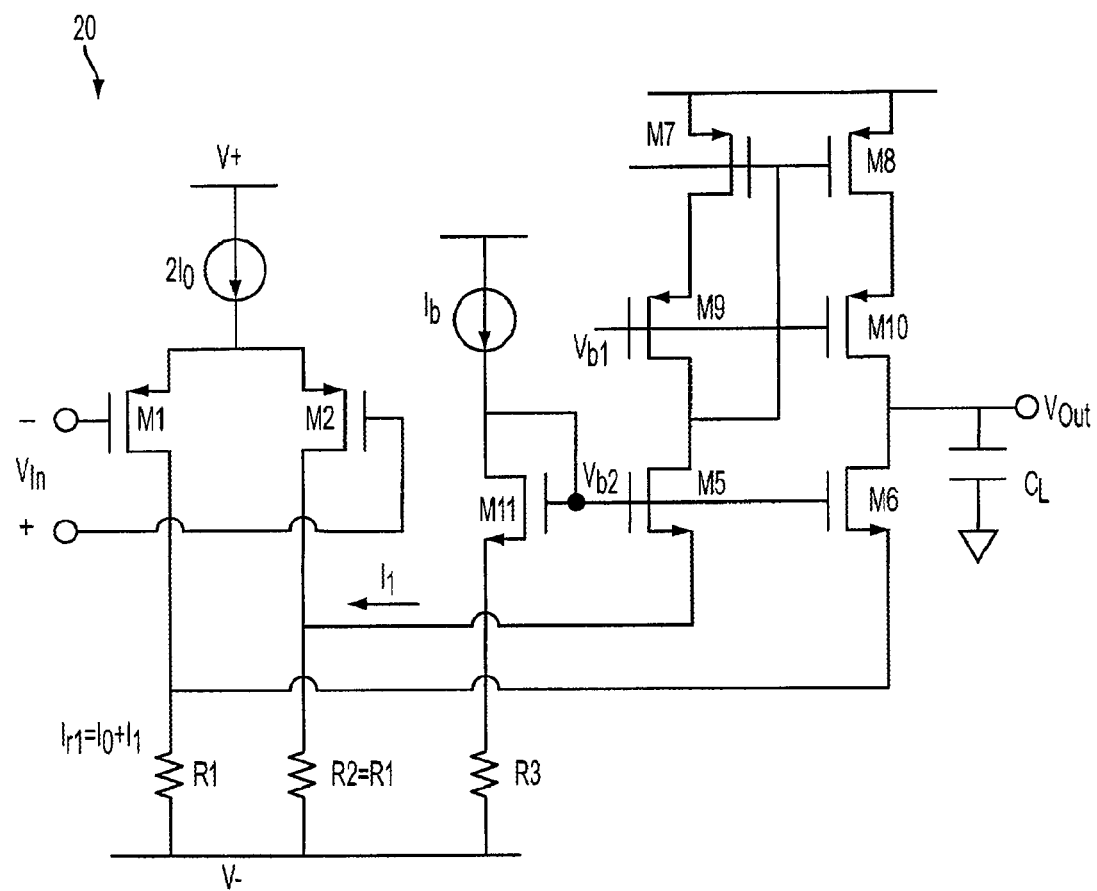
FIG. 2 is a diagram of a modification in which flicker noise is reduced by introduction of resistors, in accord with the prior art.
Figure 3:
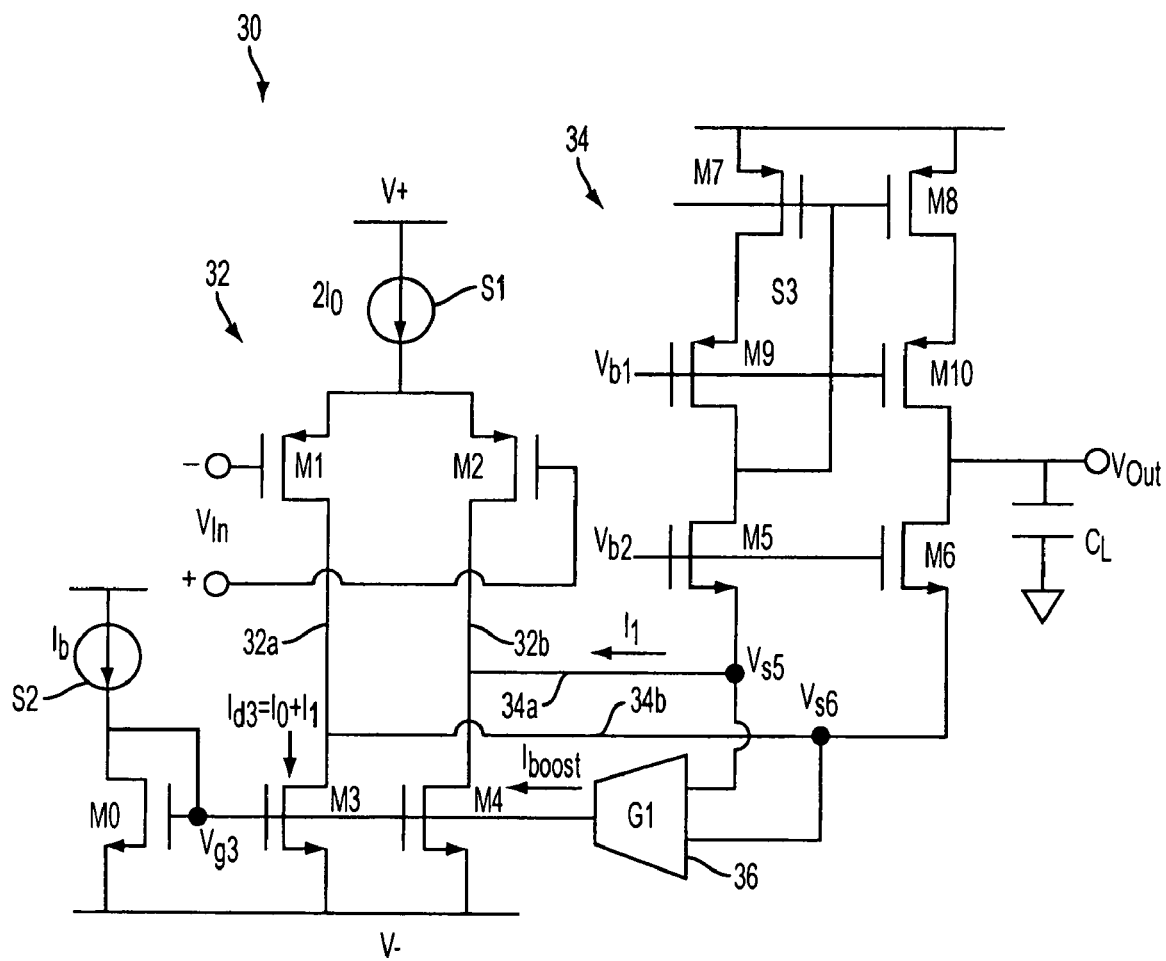
FIG. 3 is a diagram of one embodiment of a folded-cascode amplifier having slew improved in accord with the teachings herein.

FIG. 3 is a circuit diagram showing an improvement to the folded cascode amplifier 10 of FIG. 1, which enhances slew performance of the amplifier without degradation of other characteristics. Referring to FIG. 3, amplifier 30, which is powered from supply lines V+ and V−, comprises an input circuit 32 and a cascode branch circuit 34 external of and coupled to the input circuit in the manner shown, to form a folded-cascode amplifier configuration. As in FIGS. 1-2, the input circuit 32 comprises differential transistor pair M1, M2, having their sources connected commonly to a current source S1 of current $2I_o$, their drains connected, respectively, to the drains of cascode load transistors M3, M4, and their gates connected to receive a differential input signal Vin. A second current source S2 of fixed magnitude $I_b$ is coupled to the drain of transistor M0, in saturation, to produce a fixed gate bias $V_{g3}$ to the cascode load transistors M3, M4 and thereby control load current magnitude.

The magnitude of current through cascode load transistors M3, M4 is the sum of: (1) a current $I_0$ supplied by source S1 to the input circuit 32 and (2) cascode branch current $I_1$ supplied by cascode branch circuit 34. The magnitude current $I_1$ from the branch circuit 34 normally is fixed when the amplifier is not in a slew condition. In accord with this disclosure, however, the amount of current $I_1$ supplied to load M3, M4 by the cascode branch is increased while the amplifier 30 is in a slew condition in order to improve slew performance of the amplifier. The output of amplifier 30, at the junction between transistors M6 and M10, drives a load at node $V_{out}$.

Cascode branch circuit 34 comprises transistors M3-M10, with transistors M7-M9 forming a wide swing cascode mirror circuit, and transistors M3, M4 the input differential pair loads. With the exception of transconductance amplifier 36, the circuit of FIG. 3 is in substance the same as that of FIG. 1.

Transconductance amplifier 36 preferably is a window transconductance amplifier, details of which will be described later, connected to detect the voltages at nodes $V_{S5}$ and $V_{S6}$ of cascode branches 34a, 34b, tapped from the sources of transistors M5, M6. The output of transconductance amplifier 36 is applied commonly to the gates of transistors M3 and M4.

Without transconductance amplifier 36, the circuit of FIG. 3 operates in the same manner as that of FIG. 1. When amplifier 30 is not slewing, current $2I_0$ from tail current source $S_1$ splits equally between sides 32a and 32b of input circuit 32, so that a current $I_0$ will flow in each side through load transistors M3, M4. Added to that current is current $I_1$, produced by the cascode branch circuit 34. Thus, the current $I_{d3}$ flowing through the load transistors M3, M4 when amplifier is not slewing is $I_0+I_1$.

When a differential input voltage is applied to the differential pair M1, M2, the proportion of current flowing through sides 32a and 32b will change accordingly. Since the magnitude of $I_0$ is much larger than that of $I_1$ in sides 32a, 32b of input branch 32, the drain voltages at transistors M3 and M4 will change accordingly. In response, transconductance amplifier 36 supplies a boost current $I_{boost}$ to the gates of load transistors M3, M4 in order to increase branch current $I_1$ through load transistors M3, M4, thereby to improve slew performance of amplifier 30.

The threshold of window transconductance amplifier 36 may be determined by the offset of the amplifier, although any appropriate circuit topologies to vary threshold may be used. Thus, when amplifier 30 is not in a slew condition, the difference between drain voltages $V_{S5}$ and $V_{S6}$ is less than the transconductance amplifier threshold, and the transconductance amplifier does not increase branch current $I_1$ through transistors M3, M4. On the other hand, when amplifier 30 is in a slew condition, the drain voltage difference exceeds the threshold of the transconductance amplifier, which then increases $I_1$.

Figure 4:
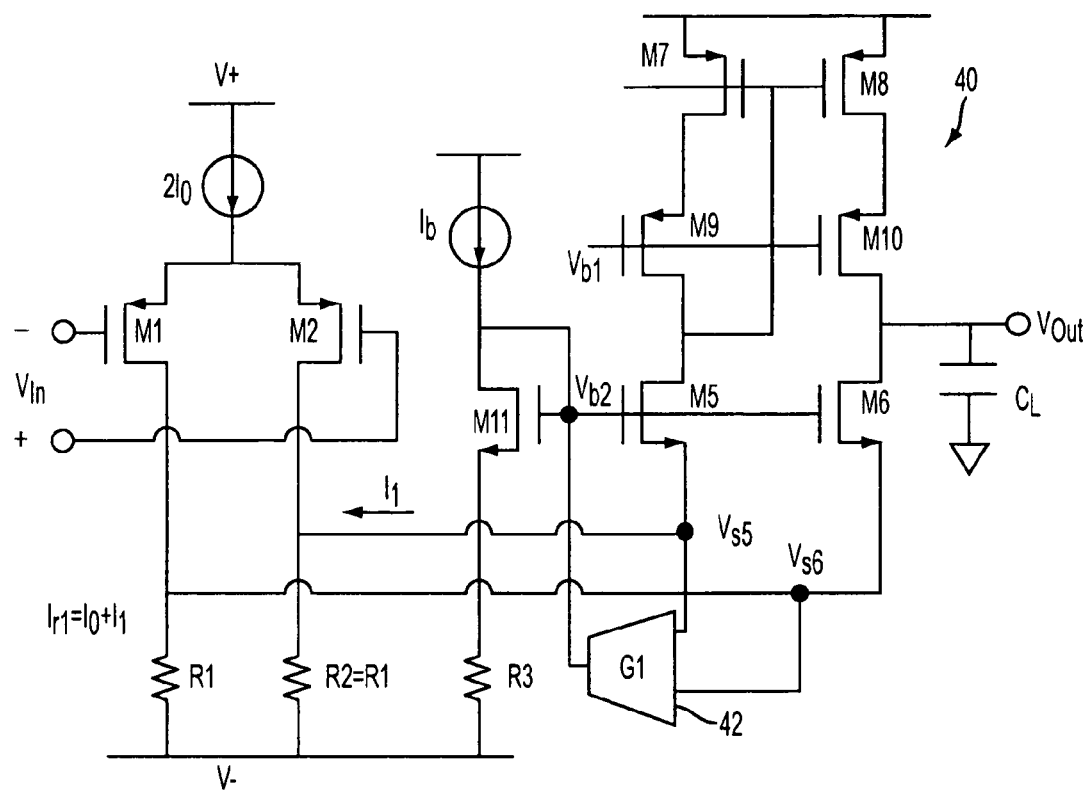
FIG. 4 is a second embodiment of improved folded-cascode amplifier.

FIG. 4 depicts another embodiment in which slew performance of the amplifier topology shown in FIG. 2 is enhanced by transconductance amplifier 42, which is configured with its inputs connected to the sources of transistors M5, M6 and its output connected to drive the gates of transistors M5, M6. Currents through transistors M5, M6 thus will increase when the difference between $V_{s5}$ and $V_{s6}$ exceeds the window threshold of the transconductance amplifier. This will occur during an amplifier slew condition of prescribed amount so as to increase $V_{b2}$ and thus increase branch current $I_1$ supplied by M5, M6 to resistors R1, R2 of the input circuit 32. An alternative to the circuit configuration shown in FIG. 4 is to supply the output of transconductance amplifier 42 to the source of transistor M11, which will increase $V_{b2}$ with the same effect.

Figure 5:
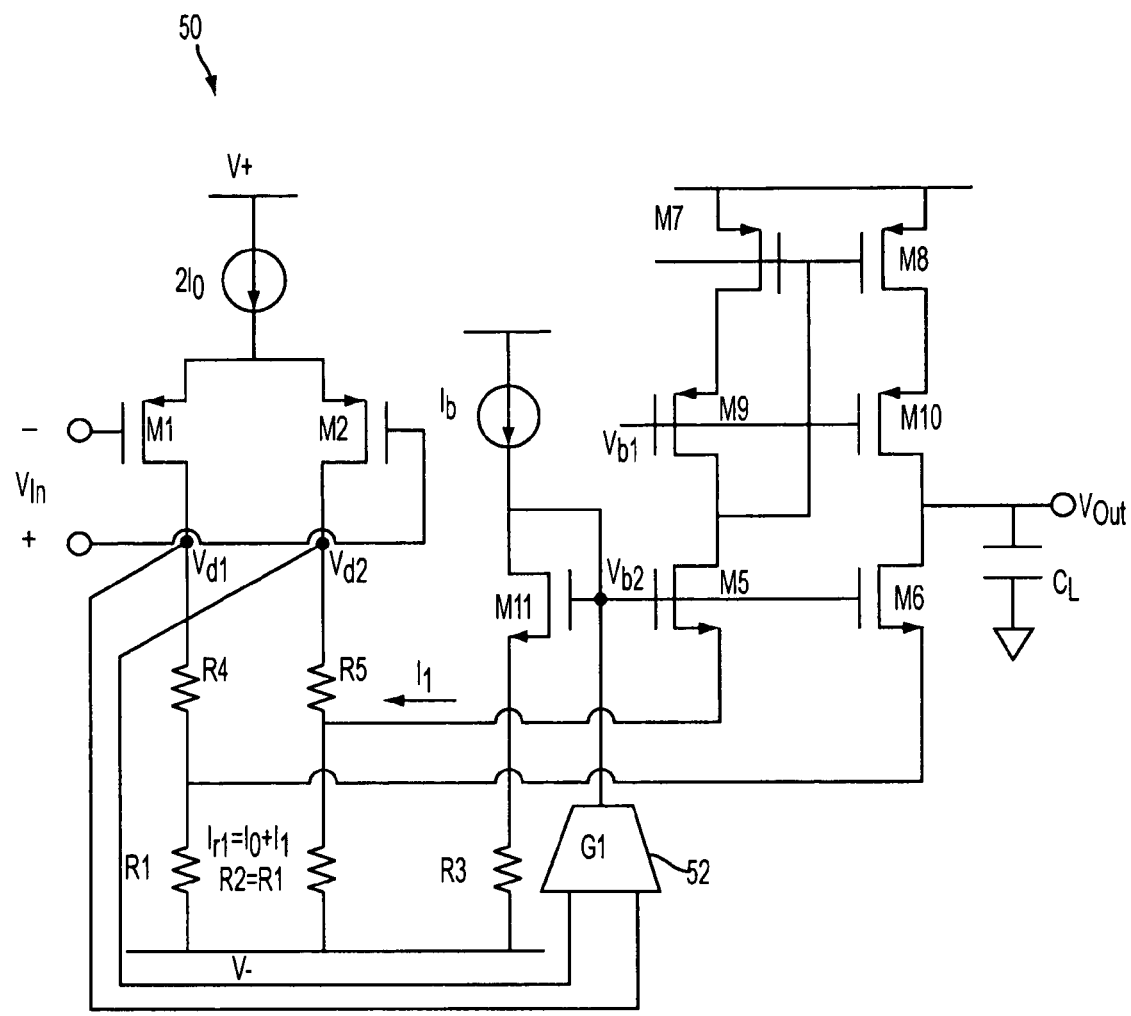
FIG. 5 is a third embodiment of improved folded-cascode amplifier.

FIG. 5 is a variant of FIG. 4, in which resistors R4 and R5 are added in series between transistor M1 and resistor R1 and between transistor M2 and resistor R2, respectively. Inputs to transconductance amplifier 52 are tapped from the junction between M1 and R4 and the junction between M2 and R5 at which $V_{d1}$ and $V_{d2}$, respectively, are produced. As the amplifier 50 slews, a greater voltage swing in $V_{d1}$, $V_{d2}$ is detected by transconductance amplifier 52 in FIG. 5 compared to that supplied to transconductance amplifier 42 in FIG. 4, so that slew performance enhancement of the folded cascode amplifier is improved.

Figure 6:
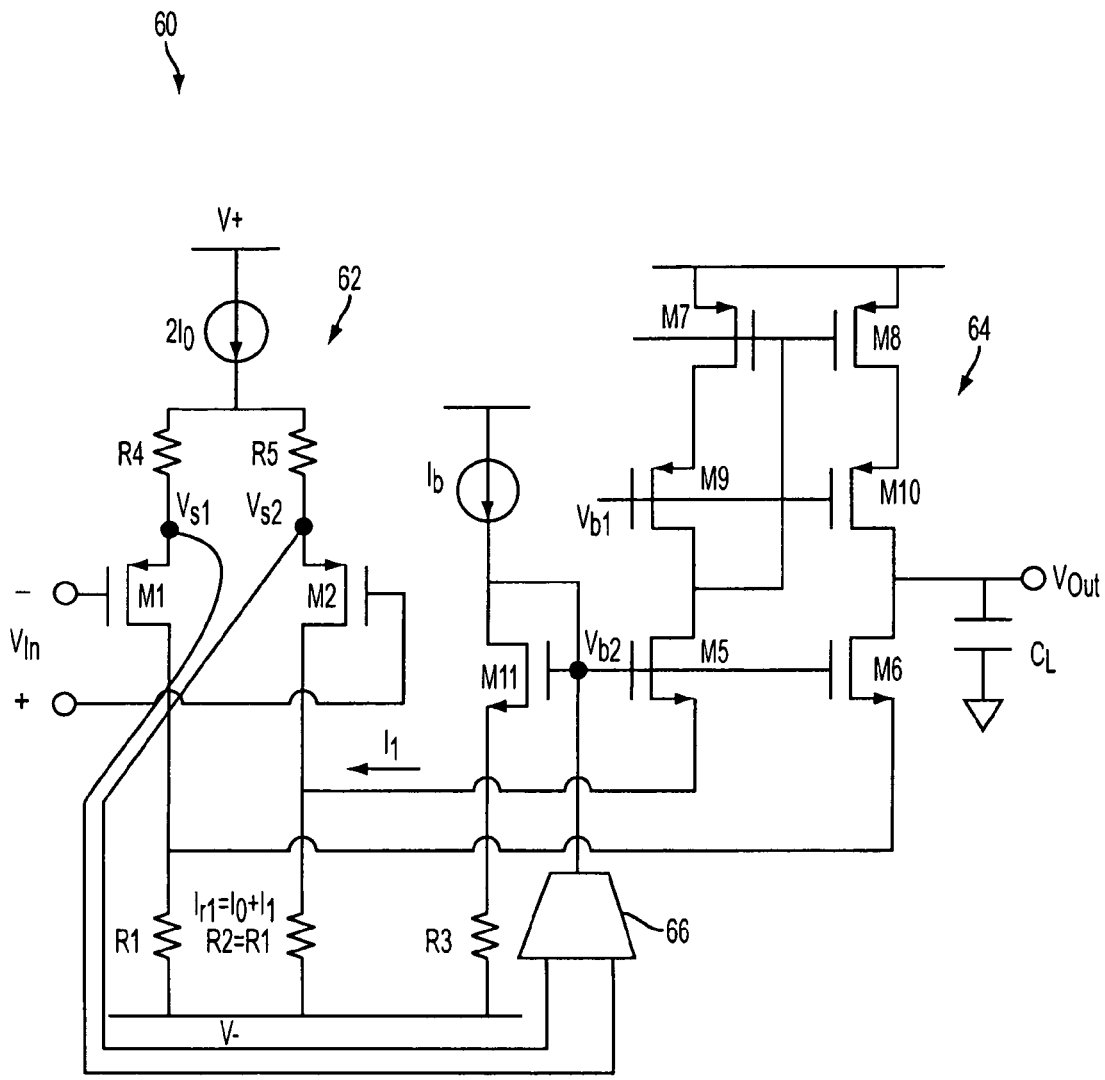
FIG. 6 is a fourth embodiment of improved folded-cascode amplifier.

FIG. 6 is a circuit diagram of another implementation of an amplifier, identified by 60, with input differential pair circuit 62 and cascode branch circuit 64, together having a topology similar to the topologies of FIGS. 4 and 5. However, in this embodiment, amplifier slew is detected at input circuit source degeneration resistors R4 and R5. When amplifier 60 is not in a slew condition, currents through degeneration resistors R4 and R5 are equal, as are voltages $V_{s1}$ and $V_{s2}$ at the sources of transistors M1, M2. No current is at this time produced by transconductance amplifier 66, whose output is coupled to the gates of transistors M5, M6 in the cascode branch circuit 64. On the other hand, during a slew condition, voltages $V_{s1}$ and $V_{s2}$ will differ by an amount that exceeds the internal threshold of transconductance amplifier 66, which in response increases branch current $I_1$.

Figure 7:
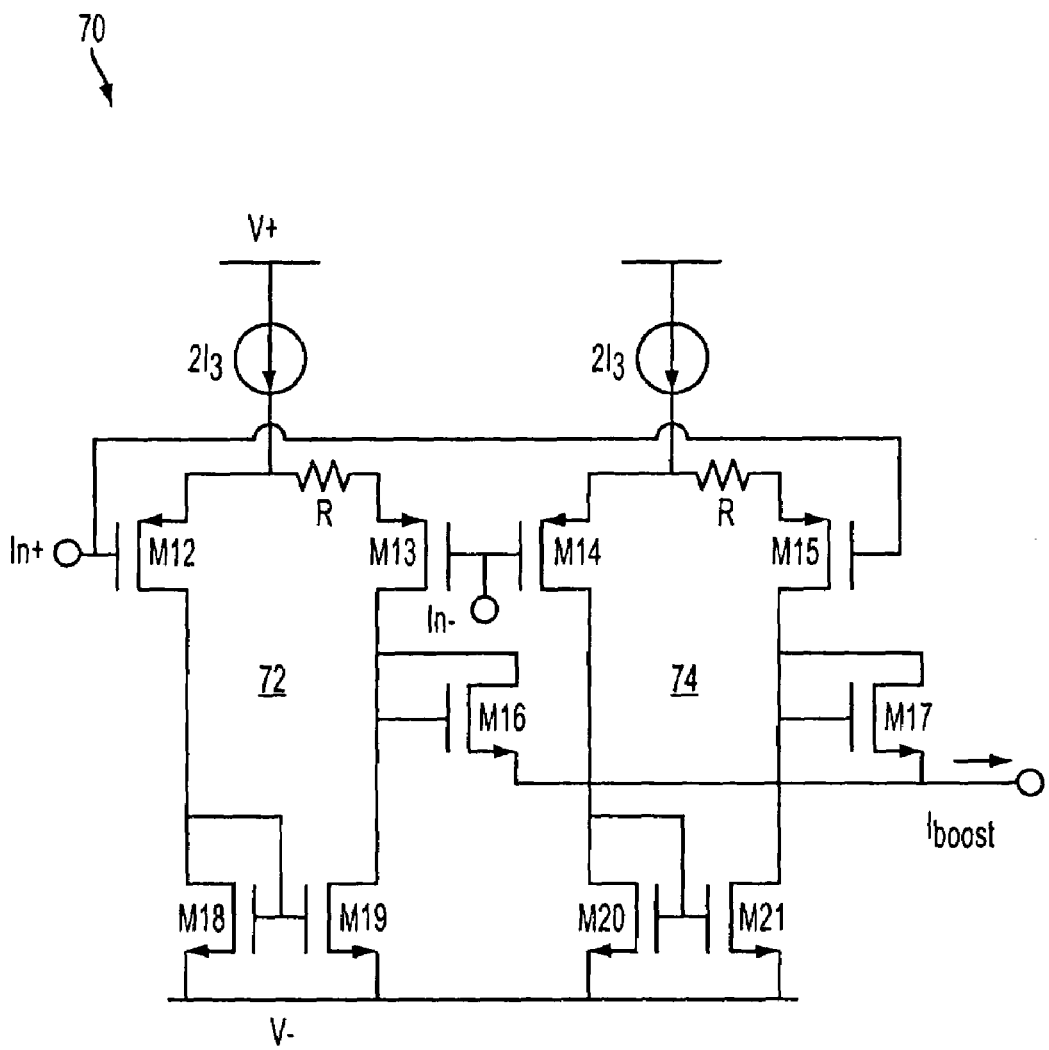
FIG. 7 is a diagram of a window transconductance amplifier that may be implemented in the described embodiments.

FIG. 7 shows an implementation of transconductance amplifier 36, 42, 52 and 66 that may be used in the described embodiments. Transconductance amplifier 70 comprises a pair of identical differential input legs 72 and 74, interconnected as shown. Leg 72 comprises differential transistor pair M12, M13 coupled to current mirror M18, M19. Similarly, differential leg 74 comprises differential transistor pair M13, M15 coupled to mirror M20, M21. The gates of transistors M13, M14 are connected commonly to one differential input node In−; the other differential input node $V_{in+}$ is connected commonly to the gates of transistors M12 and M15. Each leg receives tail current 213, divided between the sides of the legs 72 and 74 according to magnitude of the differential input voltage ($V_{in+}$-$V_{in-}$).

A resistor R is connected between a first current source 213 and the source electrodes of transistors M13 and M15, respectively. A second resistor R is connected between a second current source 213 and the source electrode of transistor M15. The output current $I_{boost}$ of the transconductance amplifier 60, which is the sum of the currents from legs 72 and 74, is taken at output transistors M16, M17 to be applied to the previously described circuits. $V_{dsat1}$ in FIG. 7 is the overdrive voltage (gate-to-source voltage minus threshold) of transistors M1 through M4 in FIG. 6 when tail current $2I_3$ is evenly split through these transistors.

Figure 8:
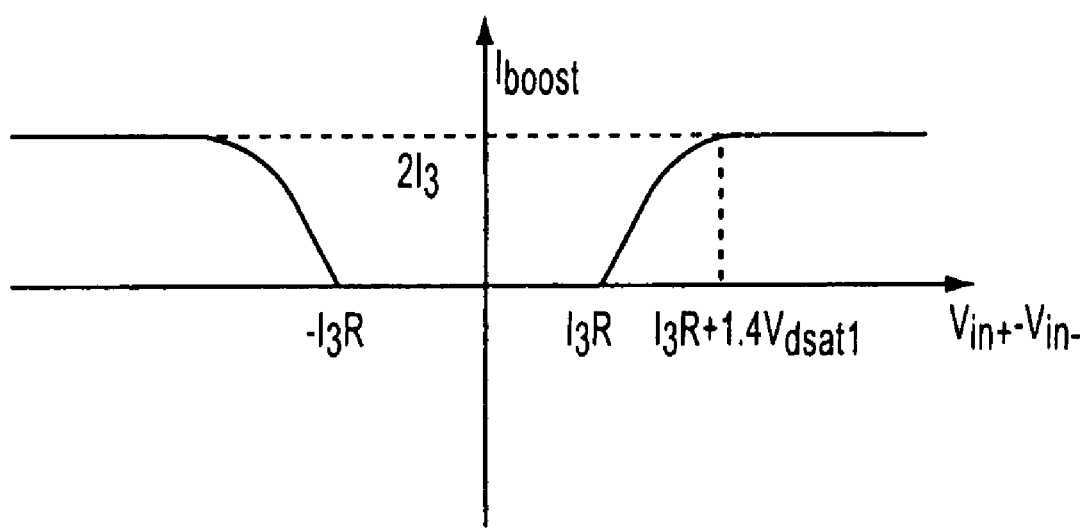
FIG. 8 shows the transfer function of the window transconductance amplifier of FIG. 7.

The purpose of resistor R in each leg of the transconductance amplifier 70 is to establish an internal threshold below which no output current $I_{boost}$ is generated. The voltage drop across each resistor R, namely $I_3R$, defines the threshold of the window. When ($V_{in-}$-$V_{in+}$) is greater than $I_3R$, the current through transistor M15 (and hence M21) is greater than that through M14 by an amount that exceeds the threshold, and the difference that is produced flows through transistor M17 as boost current $I_{boost}$ to enhance slew performance of the folded cascode amplifier. When ($V_{in-}$-$V_{in+}$) is less than $-I_3R$, the current through transistor M13 (and hence M19) is greater than that through M12, $I_{boost}$ is produced through transistor M16. When $|(V_{in-}$-$V_{in+})|$ is less than $I_3R$, no boost current is produced. FIG. 8 shows the I-V characteristic of window transconductance amplifier 70.

In this disclosure there are shown and described only preferred embodiments of the invention and but a few examples of its versatility. It is to be understood that the invention is capable of use in various other combinations and environments and is capable of changes or modifications within the scope of the inventive concept as expressed herein.

What is claimed is:

1. A folded-cascode amplifier circuit, comprising:
   a differential input circuit including a differential transistor pair coupled to a source of tail current and to a differential input signal for responsively conducting a differential first current;
   a cascode branch coupled to the differential input circuit for supplying a second current thereto; and
   a boost circuit for increasing the second current only when the amplifier is slewing at least at a prescribed rate of slew, and the boost circuit including a transconductance amplifier responsive to the differential first current for increasing the second current.

2. The amplifier circuit as recited in claim 1, wherein the cascode branch includes a current mirror.

3. The amplifier circuit as recited in claim 1, wherein the cascode branch includes a cascode current mirror circuit.

4. The amplifier circuit as recited in claim 1, wherein the differential transistor pair is coupled to cascode load elements through which the first and second currents flow.

5. The amplifier circuit as recited in claim 4, wherein the transconductance amplifier is configured to have an internal threshold corresponding to the prescribed magnitude of slew and be responsive to the differential first current for causing the second current to be increased.

6. The amplifier circuit as recited in claim 5, wherein the load components comprise MOS transistors.

7. The amplifier circuit as recited in claim 6, wherein the transconductance amplifier is connected to be responsive to an output of the load transistors, and the output of the transconductance amplifier is coupled to control inputs of the load transistors.

8. The amplifier circuit as recited in claim 4, wherein the load components comprise load resistors, the transconductance amplifier is connected to be responsive to voltage drop across the resistors, and the magnitude of the differential first current is responsive at least in part to the output of the transconductance amplifier.

9. The amplifier circuit as recited in claim 1, wherein the differential pair circuit includes a first side having a serially connected first transistor and first and second resistors, and a second side having a serially connected second transistor and third and fourth resistors, and wherein the transconductance amplifier is responsive to a difference between voltages at a first node between the first transistor and first resistor and a second node between the second transistor and third resistor, to increase the second current.

10. The amplifier circuit as recited in claim 1, wherein the differential pair circuit includes first and second transistors having corresponding first and second source resistors, and the transconductance amplifier is responsive to a voltage difference at the first and second source resistors to increase the second current.

11. The amplifier circuit as recited in claim 1, including a circuit for detecting amplifier slew, and in response controlling the boost circuit.

12. A method of improving slew performance of a folded-cascode amplifier of a type having an input differential circuit for dividing a tail current selectively between sides of the input differential circuit in response to an input differential signal, a cascode branch circuit coupled to the input differential circuit for supplying a branch current to the input differential circuit, and a boost circuit including a transconductance amplifier responsive to the differential first current for increasing the branch current, comprising the steps of determining amplifier slew, and increasing the branch current only when the amplifier is slewing at a prescribed rate of slew.

13. The method as recited in claim 12, wherein the step of increasing the branch current is performed only when slew is above the prescribed threshold value.

14. The method as recited in claim 13, including increasing the branch current only when slew is at or above a prescribed value that is greater than a threshold window.

* * * * *